(12) United States Patent
Zhang

(10) Patent No.: US 6,722,418 B2
(45) Date of Patent: Apr. 20, 2004

(54) HEAT SINK ASSEMBLY WITH GUIDING VANES

(75) Inventor: Zhiji Zhang, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/128,197

(22) Filed: Apr. 22, 2002

(65) Prior Publication Data

US 2003/0136546 A1 Jul. 24, 2003

(30) Foreign Application Priority Data

Jan. 18, 2002 (TW) ..................................... 91200438 U

(51) Int. Cl.[7] ................................................ H05K 7/20
(52) U.S. Cl. ...................... 165/80.3; 165/121; 361/697; 415/211.2
(58) Field of Search ............................... 165/80.3, 121, 165/122, 185; 415/211.2; 361/697; 174/16.3; 251/722

(56) References Cited

U.S. PATENT DOCUMENTS

| 2,653,757 | A | * | 9/1953 | Segalman | 415/211.2 |
| 6,024,536 | A | * | 2/2000 | Tsubakida et al. | 415/211.2 |
| 6,109,864 | A | * | 8/2000 | Schofield et al. | 415/211.2 |
| 6,427,763 | B1 | * | 8/2002 | Matsumoto | 165/80.3 |
| 6,459,584 | B1 | * | 10/2002 | Kuo | 361/704 |
| 6,503,060 | B1 | * | 1/2003 | Kamada et al. | 415/211.2 |
| 6,547,540 | B1 | * | 4/2003 | Horng et al. | 415/211.2 |

FOREIGN PATENT DOCUMENTS

| EP | 0547253 | * | 6/1993 | 415/211.2 |

* cited by examiner

*Primary Examiner*—Leonard R Leo
(74) *Attorney, Agent, or Firm*—Wei Te Chung

(57) ABSTRACT

A heat sink assembly includes a heat sink (10), a fan fixing device (30), and a fan (60). The heat sink has a base (12), and a plurality of fins (14) extending from the base. Two threaded holes (18) are defined in each of opposite sides of the base. The fan fixing device has a frame (32), and four legs (36) respectively depending from four corners of the frame. A plurality of concentric guiding vanes (34) is formed on the frame. The guiding vanes have slanted surfaces for guiding airflow toward a central portion of the heat sink. An aperture (42) is defined in an end of each leg. A first screw (102) extends through each aperture and engages in a corresponding threaded hole of the heat sink. The fan is attached to the frame with a plurality of second screws (100).

7 Claims, 3 Drawing Sheets

HEAT SINK ASSEMBLY WITH GUIDING VANES

BACKGROUND OF THE INVENTION

1. Field of the Invention

The present invention relates to heat sink assemblies, and particularly to a heat sink assembly having a fan fixing device for attaching a fan to a heat sink and improving heat dissipating airflow.

2. Related Art

Developments in today's highly information-intensive society have led to remarkable improvements in performances of electronic devices. During operation of many contemporary electronic devices such as central processing units (CPUs), large amounts of heat are produced. Such heat must be quickly removed from the electronic device, to prevent the system from becoming unstable or being damaged. Typically, a heat sink together with a fan is attached to an outer surface of the device to facilitate removal of heat therefrom.

Examples of conventional heat sink assemblies are disclosed in Taiwan Patent Applications Nos. 86204117, 87217628 and 86220693. Oftentimes, a fixing device for attaching a fan to a heat sink comprises a base, and a plurality of locking means for accommodating and locking the fan onto the heat sink. A circular opening is defined in a center of the base, for providing airflow access for the fan. However, a heat-generating electronic device is generally located under a center of a base of the heat sink, and the fan is a rotary fan disposed over a center of the heat sink. A temperature of the heat sink is highest at its center, yet airflow from the fan is concentrated around peripheral regions of the heat sink. The airflow does not efficiently remove heat from the center of the heat sink, the very region where heat removal is most needed.

An improved means of securing a fan to a heat sink which overcomes the above-mentioned problems is desired.

BRIEF SUMMARY OF THE INVENTION

Accordingly, an object of the present invention is to provide a heat sink assembly having a fan fixing device which can improve heat dissipating efficiency.

Another object of the present invention is to provide a heat sink assembly having a fan fixing device which firmly and reliably attaches a fan to a heat sink.

To achieve the above-mentioned objects, a heat sink assembly of the present invention comprises a heat sink, a fan fixing device, and a fan. The heat sink has a base, and a plurality of fins extending from the base. Two threaded holes are defined in each of opposite sides of the base. The fan fixing device has a frame, and four legs respectively depending from four corners of the frame. A plurality of concentric guiding vanes is formed on the frame. The guiding vanes have slanted surfaces for guiding airflow toward a central portion of the heat sink. An aperture is defined in an end of each leg. A first screw extends through each aperture and engages in a corresponding threaded hole of the heat sink. The fan is attached to the frame with a plurality of second screws.

Other objects, advantages and novel features of the present invention will be drawn from the following detailed description of a preferred embodiment of the present invention with the attached drawings, in which:

DESCRIPTION OF THE PREFERRED EMBODIMENT

Figure 1:
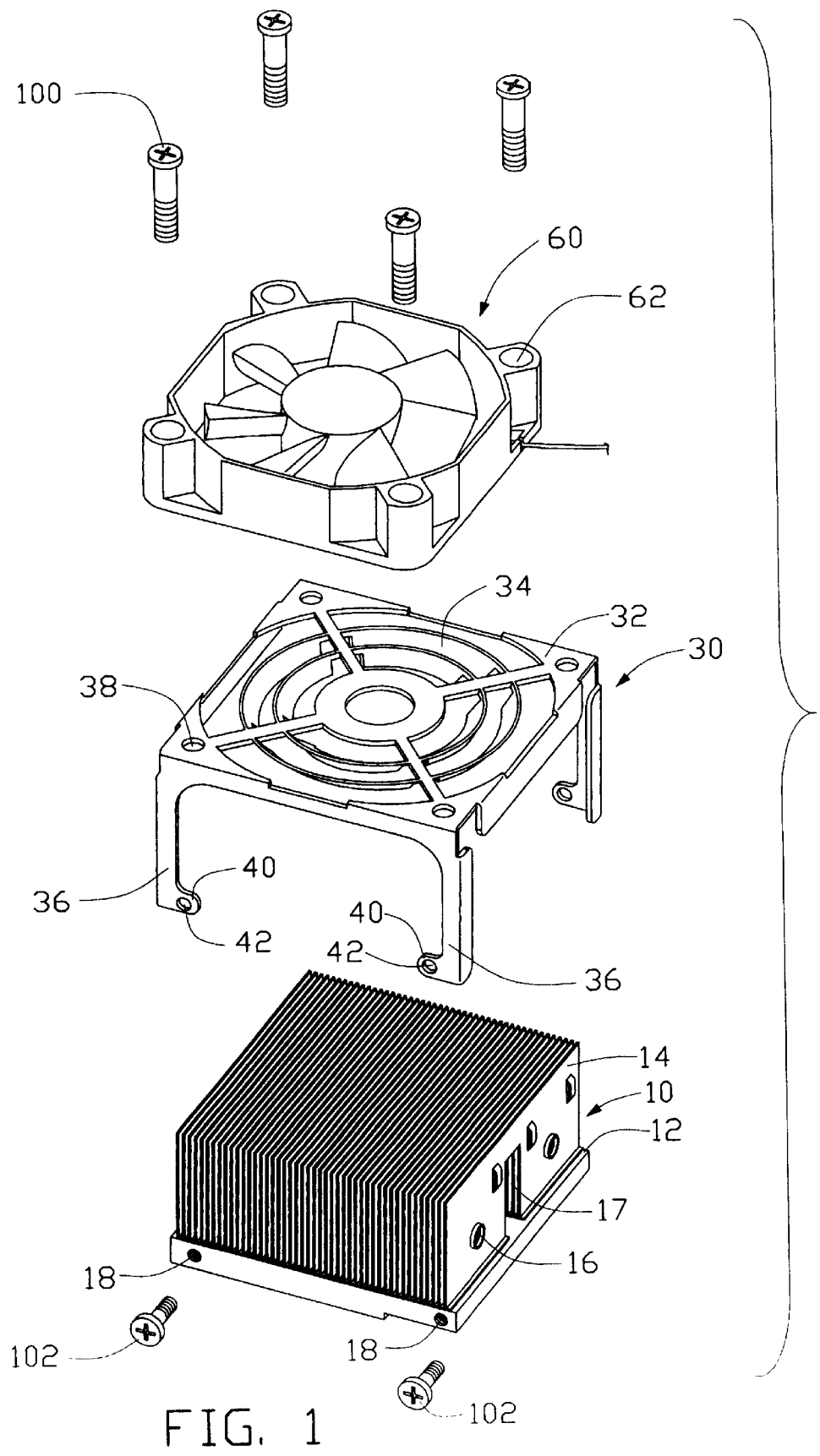
FIG. 1 is an exploded view of a heat sink assembly in accordance with the present invention.

Referring to FIG. 1, a heat sink assembly in accordance with the present invention comprises a heat sink 10, a fan fixing device 30 and a fan 60. The heat sink 10 comprises a rectangular base 12, and a plurality of fins 14 arranged parallel to each other to form an array of fins 14 on a top surface of the base 12. A channel 17 is transversely defined through a middle of the array of fins 14 above the base 12, for accommodating a clip (not shown). Two passages 16 are transversely defined through the array of fins 14, on respective opposite sides of and parallel to the channel 17. Tools (not shown) are extended through the passages 16 to assemble the array of fins 14 together, and to place the array of fins 14 onto a top surface of the base 12. A pair of spaced threaded holes 18 is defined in each of two opposite side faces of the base 12, for extension of corresponding first screws 102 thereinto. Each of the opposite side faces of the base 12 corresponds to ends of the fins 14 of the array of fins 14.

Figure 2:
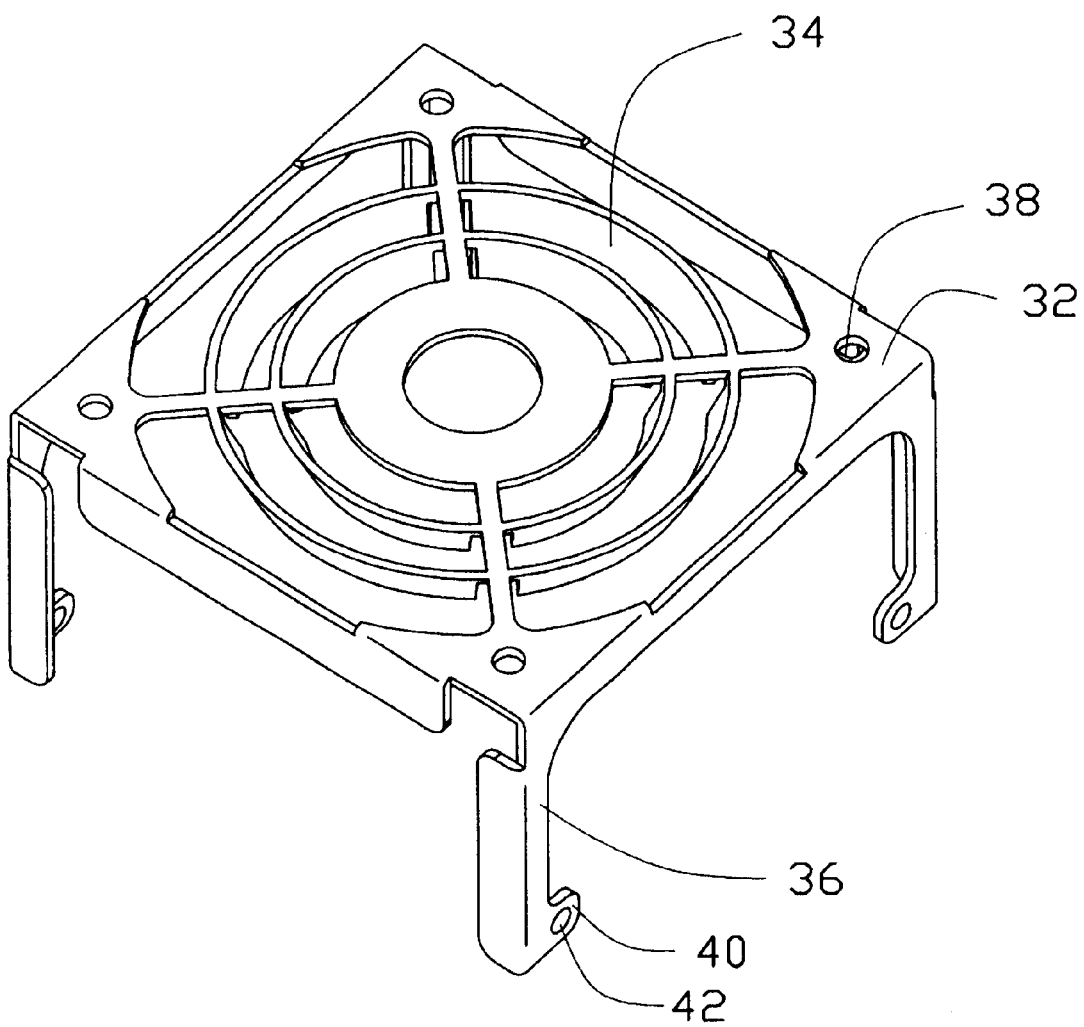
FIG. 2 is an enlarged perspective view of a fan fixing device of the heat sink assembly of FIG. 1.

Referring also to FIG. 2, the fan fixing device 30 comprises a rectangular frame 32 with openings therein and four legs 36 respectively depending from four corners of the frame 32. A plurality of circular concentric guiding vanes 34 aside the corresponding opening, are formed in a center of the frame 32. Each guiding vane 34 is slanted downwardly toward a center of the frame 32, for guiding airflow toward a center of the fan fixing device 30. Four screw holes 38 are respectively defined in four corners of the frame 32. A pair of opposing tabs 40 is respectively formed at bottom ends of two of the four legs 36 which are at one side of the fan fixing device 30. Another pair of opposing tabs 40 is respectively formed at bottom ends of the other two of the four legs 36 which are at an opposite side of the fan fixing device 30. An aperture 42 is defined in each of the tabs 40.

The fan 60 has four through holes 62 respectively defined in four corners thereof, for extension of four corresponding second screws 100 therethrough.

Figure 3:
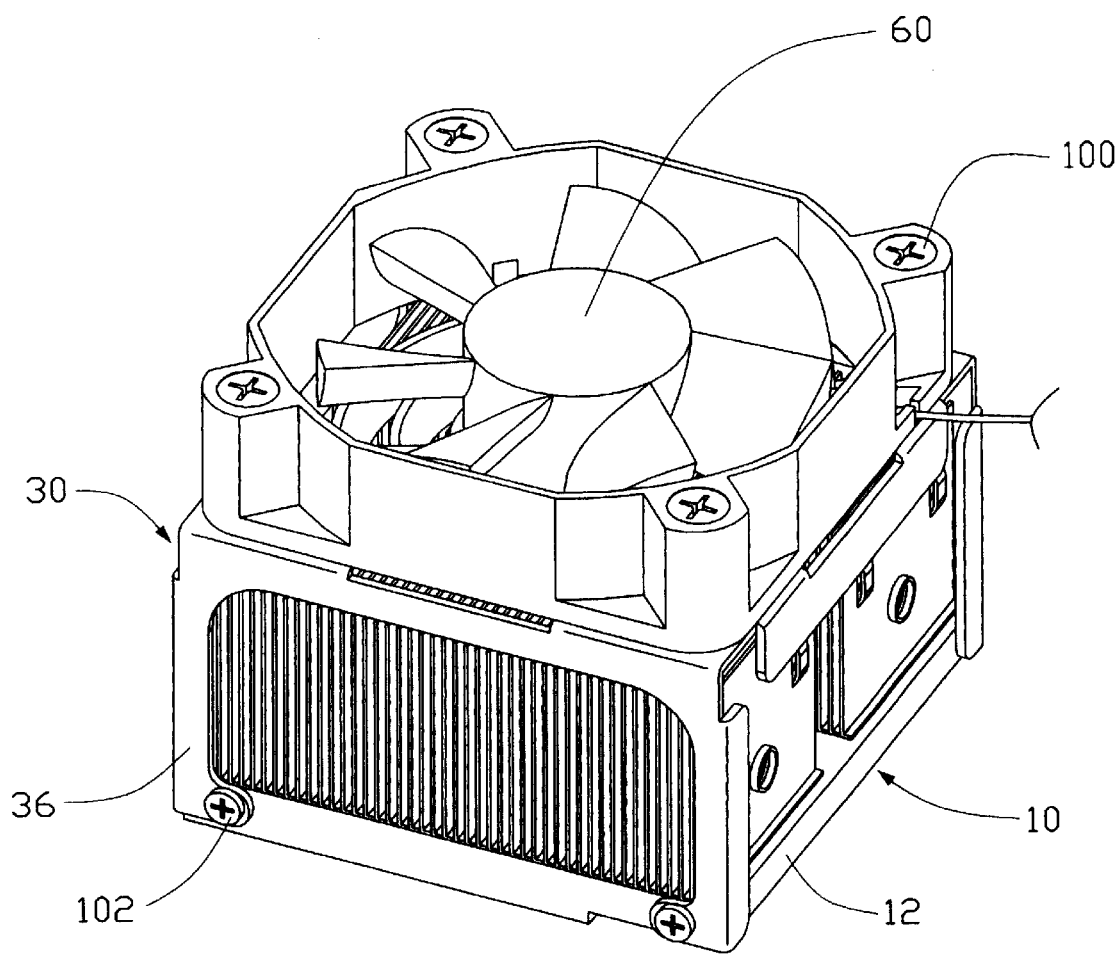
FIG. 3 is an assembled view of FIG. 1.

Referring also to FIG. 3, in assembly, the fan fixing device 30 is placed over the heat sink 10. The apertures 42 of the fan fixing device 30 are aligned with the threaded holes 18 of the base 12 of the heat sink 10. The first screws 102 are extended through the apertures 42 and engaged in the threaded holes 18. The fan 60 is mounted onto the fan fixing device 30. The second screws 100 are extended through the through holes 62 of the fan 60 and engaging in the screw holes 38 of the frame 32 of the fan fixing device 30.

In operation, airflow generated by the fan 60 is guided by the slanted guiding vanes 34 of the fan fixing device 30 toward a center of the heat sink 10. Thus, heat concentrated at the center of the heat sink 10 is efficiently removed by the airflow.

It is understood that the invention may be embodied in other forms without departing from the spirit thereof. Thus, the present example and embodiment are to be considered in all respects as illustrative and not restrictive, and the invention is not to be limited to the details given herein.

What is claimed is:

1. A heat sink assembly comprising:
   a heat sink having a base and a plurality of fins extending from the base;
   a fan fixing device attached to the heat sink, the fan fixing device comprising a frame which has a plurality of slanted concentric guiding vanes, wherein the guiding vanes are generally circular and slanted downwardly toward a center of the frame; and a fan attached to the fan fixing device, wherein airflow generated by the fan is guided toward a central portion of the heat sink by the slanted guiding vanes of the fan fixing device.

2. The heat sink assembly as described in claim 1, wherein the fan fixing device further comprises a plurality of legs depending from the frame, and an aperture is defined in a bottom end of each of the legs.

3. The heat sink assembly as described in claim 2, wherein at least one threaded hole is defined in each of two opposite sides of the base of the heat sink, and a plurality of screws extends through the apertures of the fan fixing device and engages in the corresponding threaded holes.

4. The heat sink assembly as described in claim 1, wherein a plurality of screw holes is defined in the frame of the fan fixing device, and a plurality of through holes is defined in the fan, and a plurality of screws extends through the through holes of the fan and engages in the corresponding screw holes.

5. The heat sink assembly as described in claim 1, wherein a plurality of passages is defined in the fins of the heat sink.

6. The heat sink assembly as described in claim 1, wherein the plurality of fins extends upwardly from the base.

7. A method of removing heat from a heat generating device, comprising steps of:

(A) providing a heat sink with a base adapted to be engaged with the heat generating device around a center portion of an undersurface thereof and a plurality of fins extending above an upper surface of said base;

(B) fixedly positioning a fan fixing device above the heat sink, said fan fixing device including a frame defining a plurality of concentric circumferential openings equipped with a plurality of concentric circumferential slanted guiding vanes around said openings, respectively, for guiding an airflow toward a center portion of the heat sink; and (C) fixedly positioning a fan on the frame of said fan fixing device to generate said airflow wherein said airflow passes through said openings and hits said corresponding guiding vanes to move toward the center portion of the heat sink.

* * * * *